(12) United States Patent
Foulon et al.

(10) Patent No.: US 6,259,099 B1
(45) Date of Patent: Jul. 10, 2001

(54) ULTRA-THIN IONIZING RADIATION DETECTOR AND METHODS FOR MAKING SAME

(75) Inventors: François Foulon, Orsay; Serge Spirkovitch, Vincennes; Lionel Babadjian, Channeloup-en-Brie, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/091,656

(22) PCT Filed: Dec. 18, 1996

(86) PCT No.: PCT/FR96/02019

§ 371 Date: Sep. 18, 1998

§ 102(e) Date: Sep. 18, 1998

(87) PCT Pub. No.: WO97/23003

PCT Pub. Date: Jun. 26, 1997

(51) Int. Cl.[7] ............... H01L 31/103; H01L 31/108; H01L 31/0352; H01L 31/115

(52) U.S. Cl. ............... 250/370.14; 250/370.01; 257/428

(58) Field of Search ............... 250/370.14, 370.01; 257/428, 54, 457

(56) References Cited

U.S. PATENT DOCUMENTS 5,306,943 * 4/1994 Ariyoshi et al. ............... 257/457
5,798,558 * 8/1998 Tyson et al. ............... 257/458

FOREIGN PATENT DOCUMENTS 33 33 410    4/1985 (DE).
0 279 492    8/1988 (EP).
0 416 798    3/1991 (EP).
2 284 989    4/1976 (FR).

OTHER PUBLICATIONS

Patent Abstract of Japan vol. 012, No. 277 (E–640), JP 63 055980 A (Matshshita Electric Works Ltd), Mar. 10, 1988.
Cleo '94. Summaries of Papers Presented at the Conference on Lasers and Electro–Optics. vol. 8. 1994 Technical Digest Series. Conference Edition (Cat. No. 94CH3463–7), Proceedings of 1994 Conference on Lasers and Electro–Optics and the International EL, ISBN 0–7803–1971–0 1994, Washington, DC, USA, Opt. Soc. America, USA, p. 22 XP000601776 Liu M Y et al: "140 GHz MSM photodetectors in silicon–on–insulator".
IEEE Transactions on Nuclear Science, Aug. 1993, USA, pp. 753–758, XP000601780 Dierickx B et al : "Integration of CMOS–electronics and particle detector diodes in high–resistivity silicon–on–insulator wafers".
Thin Soi Structures for Sensing and Integrated Circuit Applications, Sensors and Actuators A, 39 241–251; Gwiy–Sang Chung, (1993).
A Fully CMOS–Compatible Infrared Sensor Fabricated on Simox Substrates, Sensors and Actuators A, 41–42 (1994) 538–541; M. Muller, et al.

* cited by examiner

Primary Examiner—Georgia Epps
Assistant Examiner—Richard Hanig
(74) Attorney, Agent, or Firm—Burns Doane Swecker & Mathis

(57) ABSTRACT

Ultra-thin ionizing radiation detector, and processes of manufacturing such detector. The detector includes a stack made up of a substrate, an insulting layer and a thin superficial layer of silicon, a detection diode being fabricated in the superficial layer.

28 Claims, 7 Drawing Sheets

ULTRA-THIN IONIZING RADIATION DETECTOR AND METHODS FOR MAKING SAME

DESCRIPTION

1. Technical Field

The present invention relates to an ultra-thin detector of ionizing radiation such as, for example, UV photons, X photons and α or β particles, and to processes for manufacturing such detector.

Detectors in accordance with this invention find numerous applications for the detection of charged particles or neutrons in media having strong gamma background noise, for the measurement of flight time of heavy ions or, further, for the on-line measurement of flows such as flows of X radiation or of protons.

The invention also finds applications for the production of so-called <<intelligent>> detectors formed by a stack of several detectors whose thickness is adjusted to various types of radiation to be detected simultaneously.

2. State of the Prior Art

Semiconductor radiation detectors operate along the principle of the collection of charges, formed by electron-hole pairs, and generated by interaction of ionizing radiation with matter. When crossing through the semiconductor material, such radiation transfers to the latter all or part of its energy and causes the generation of electron-hole pairs. For example, energy in the region of 3.6 eV is required to generate an electron-hole pair in silicon.

Figure 1:
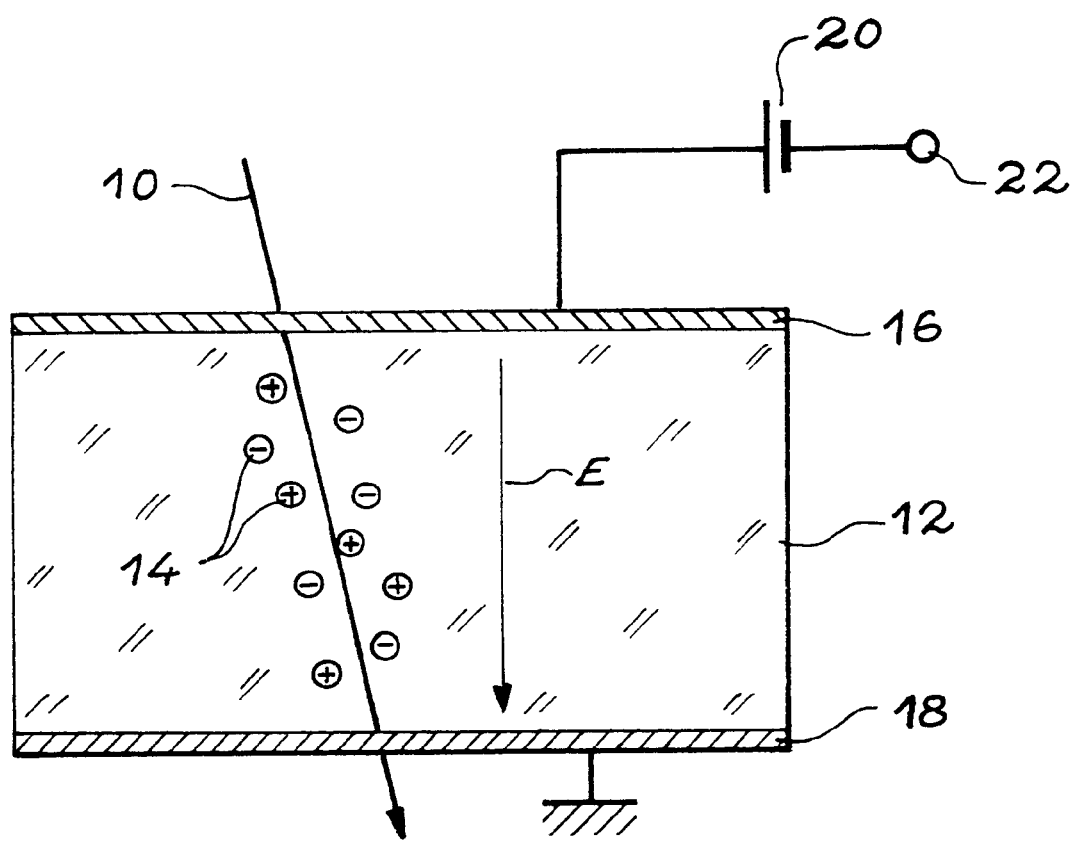

The diagram in FIG. 1 illustrates the operation of a silicon detector. When ionizing radiation shown by arrow 10 crosses through a silicon block 12, electron-hole pairs 14 are generated in the latter. Electrodes 16 and 18, respectively covering opposites surfaces of the silicon block, are connected to a voltage source 20 and earth respectively to create an electric field E within silicon block 12. Under the effect of this field, the charges, that is to say the electrons and holes, migrate towards electrodes 16 and 18 and may be collected on the detector terminals, for example terminal 22, to produce an electric signal which may be recorded.

If electric field E is constant throughout all the detector volume, for each photon or each incident particle 10, regardless of their interaction volume with the semiconductor, it is possible to record an electric impulse at the detector terminals that is proportional to the energy that the photon or particle has transferred to the silicon. However, the electron-hole pairs have a natural propensity to recombine with one another, and the signal is only equal to the transferred energy if the distance of free movement of the electrons and holes before their recombination is greater than the thickness of the detector.

The transfer of radiation energy to matter is related to the type and energy of incidental radiation. This transfer takes place according to different processes and with different energy losses. As an illustration, table I below gives approximate thicknesses of silicon (e) required to absorb 90% of the energy of incidental radiation from different types of radiation and charged particles.

Radiation energy losses nevertheless have a statistical character and the values given in table I correspond to average thicknesses that are required for the absorption of 90% of radiation. For example, a gamma photon of 500 keV crossing through a silicon detector 300 μm thick (standard detector), has a reaction probability of $7 \times 10^{-4}$ in the detector, leading an energy transfer to the silicon of 150 to 200 keV. In the event of a strong flow of gamma photons in the region of $10^5$ photons per second, 70 electric impulses per second are recorded at the terminals of the detector, corresponding to a photon energy loss in the detector of 150 to 200 keV. In fact, an entire series of impulses are recorded, corresponding to energy losses of between 0 and 500 keV.

In a certain number of applications of semiconductor detectors, it would be desirable for such detectors to have a thickness of between 0.1 μm and a few tens of micrometres.

As an example, if the radiation comprises several types of radiation corresponding to very different absorption thicknesses in the silicon, and it is required only to measure one type of radiation, for example that corresponding to the smallest absorption thickness, it would be desirable to use a detector whose thickness is precisely equal or close to this absorption thickness.

For example, to detect alpha particles of 1 MeV in a medium having a strong gamma radiation interference signal, the alpha signal to gamma signal ratio is optimum for a silicon detector approximately 4 μm thick, corresponding to the absorption thickness of alpha particles. For such detector, all the alpha particles lose all their energy in the detector. A very small proportion of gamma photons (<1/1000) undergoes interaction with the detector and the gamma photons which interact with the silicon lose a very small quantity of energy. Since the electric signal is directly proportional to the energy lost by radiation in the silicon, the alpha signal is therefore far superior to the gamma signal.

A further application requiring the availability of thin detectors is the measurement of X radiation, gamma radiation and/or on-line particles, when the radiation loses its energy in the silicon in virtually uniform manner.

For example, for the on-line measurement of the flow of alpha particles of 5.5 MeV, the detector needed is one such that the energy losses are in the region of 100 keV, so that particle counting is possible without the particle energy loss being too high. In particular, in the case of this example, a silicon detector having a thickness of approximately 0.5 μm would be suitable.

At the current time, surface barrier silicon detectors that are commercially available have a thickness of approximately 10 μm or over.

These detectors are generally obtained by mechanical thinning of silicon wafers that are several hundred micrometers thick. For reasons related to mechanical resistance and control over the remaining thickness, it is very difficult to produce detectors by mechanical thinning having a thickness of less than 10 μm.

Also, wafer thickness is only controlled to a precision of approximately ±1.5 μm. These detectors are therefore not adapted to the above-mentioned applications.

TABLE I

| Radiation | Visible 600 nm | UV 200 nm | X 1 keV | X 10 keV | X 100 keV | Gamma 1 MeV | alpha 1 MeV | alpha 5 MeV | electron 50 keV |
|---|---|---|---|---|---|---|---|---|---|
| e(μm) | 2 | 0.02 | 7 | 300 | $2.3 \cdot 10^5$ | $3.6 \cdot 10^5$ | 3 | 25 | 20 |

Document (1) referenced at the end of this disclosure concerns a radiation detector with a detection diode made in a thick layer of silicon. This detector is associated with an electronic circuit fabricated in a superficial layer of silicon insulated from the thick silicon layer by an insulating oxide layer. The thickness of the layer (100 μm) eliminates this type of detector from the field of application under consideration which concerns thin detectors. Document (2) also referenced at the end of this disclosure describes a heat insulated radiation detector using a diode with a structure of MESA type. With the technique described in this document it is not possible either to produce thin detectors. Finally, document (3) concerns photodiodes made in the thin layer of a SOI substrate. These diodes are not however adapted to the detection and spectrometry of ionizing radiation.

Finally, one purpose of the present invention is to describe a thin detector having a thickness of preferably between 0.1 and 10 μm. Another purpose is to make available a detector whose thickness can be controlled with great precision. A further purpose of the invention is also to make available an ultra-thin detector which can be used not only to conduct counting of the number of photons or charged particles received, but also to perform energy spectroscopy of this radiation. The invention also sets out to describe simple processes for producing such detectors. The invention also proposes a process of for manufacturing thin detectors having low capacity and obscurity current compared with those obtained using conventional techniques.

DESCRIPTION OF THE DISCLOSURE

To reach these objectives, the object of the invention is more precisely an ionizing radiation detector having a detection diode formed in a thin superficial layer of SOI structure comprising a stack made up of a silicon substrate, an insulating layer of silicon oxide and the thin superficial layer of silicon, the diode comprising a first and a second layer, so-called junction layers, respectively forming with at least one portion of the superficial layer a rectifying junction and an ohmic junction, allowing the establishment, by applying a voltage, of an electric detection field in said portion of thin layer, characterized in that the first and second junction layers have main faces facing each other that are substantially parallel to establish a substantially constant electric field between them.

For the purposes of this invention, by ionizing radiation is meant any radiation likely to create electron-hole pairs. The radiation may therefore be ultraviolet, X, or gamma radiation, or even charged particles such as alpha or beta particles or, finally, neutrons after conversion of the latter into alpha particles (boron 10) or beta particles (gadolinium).

Also, by <<rectifying junction>>, is meant either a junction of Schottky type or a junction of PN type. A Schottky type junction is also called <<rectifying contact>> in current technical language. An ohmic junction is also termed an <<ohmic contact>> in current technical language.

With the characteristics of the invention, it is possible to establish an electric field between the junction layers, that is constant in the effective volume (deserted zone of the detector). This constant electric field allows the collection of a charge quantity at the terminals of the detector that is proportional to the quantity of charges generated by the ionizing radiation. Therefore, an energy spectrometric measurement is possible.

Spectrometry requires either that all charges (electrons and holes) generated by the ionizing radiation are collected at the detector terminals, or that the quantity of charges collected at the detector terminals is proportional to the quantity of charges generated by the ionizing radiation. In the first case, the charge collection distance (distance covered by the charges before recombination) must be greater than the inter-electrode distance, that is to say the distance between the first and second junction layers. In practice, this generally requires the application of a reverse voltage to the diode terminals to ensure that the collection distance is greater than the inter-electrode distance throughout the entire detection volume. The collection distance is limited by the electric properties of silicon, in the case of highly pure crystalline silicon to approximately 700 μm. In the second case, if it is required that the quantity of collected charges is proportional to the quantity of generated charges, the voltage applied to reverse polarize the device must lead to establishing an inner electric field that is substantially constant throughout the entire effective volume (deserted zone) of the detector.

The thickness of the detectors made using this invention is preferably between a few microns and a few tens of microns. From a technical viewpoint, this thickness is fixed by the thickness of the thin layer of SOI substrate. Also, the detection surfaces typically lie between approximately 100 μm×100 μm and 1 cm×1 cm. The surface of the Schottky or PN diode is fixed by the surface of the Schottky contact or PN interface respectively. The volume of detection is determined by the surface of the diode and the thickness of the diode. It must allow spectrometric measurement of the energy lost by incidental radiation in the detection device. For the detection of alpha particles, the generation of charges takes place along the distance covered by the particle in a column having a diameter of less than one micron. For beta particles and X radiation, charge generation takes place schematically within a sphere whose radius is related to the energy of incidental radiation and is in the region of one tenth of a micron. It is therefore clearly apparent that the volume in which the charges are generated is very small compared with the detection volume.

According to a first embodiment of the invention, said first junction layer is a layer of first metal placed in contact with a free face of the portion of superficial thin layer and forms with this portion of layer a junction of Schottky type.

The silicon used to make the superficial thin layer is preferably silicon with high resistivity.

To detect radiation crossing through the superficial thin layer, the detection diode is reverse polarized.

The thickness of the superficial thin layer may advantageously be chosen in relation to the type and energy of the radiation it is required to detect. This thin layer is not obtained by thinning a thick wafer, but its thickness is fixed by initial SOI structure. It is known, and they are commercially available, how to make SOI substrates whose superficial thin layers have a thickness of between 0.1 μm and 100 μm, controlled to a precision of approximately 10%.

According to a second embodiment of the detector of the invention, said first junction layer is a region of the superficial thin layer and has a first type of conductivity, the region being in contact with a second, so-called intermediate, region of the superficial thin layer having a second type of conductivity opposite to the first type of conductivity and forming with the latter a PN-type junction.

The first type of conductivity is, for example, N-type conductivity, and the second type is P-type conductivity. The intermediate region of the superficial thin layer is therefore doped with acceptor impurities and conduction is made by free holds. The detection region is therefore in silicon doped with donor N-type impurities. The junction formed is a PN type junction.

However the detector is made, it may be equipped with a contact point connected to the undersurface of the superficial thin layer and accessible by one of the faces of the superficial layer of the SOI structure.

According to a particular implementation of the invention applicable to either one of the embodiments of the detector of the invention, said second junction layer is a layer of a second metal placed in contact with one face of the superficial thin layer opposite the first junction layer, and forming an ohmic contact with the portion of superficial layer.

The layer of second metal and the portion of superficial layer also from a heterojunction. It is however a non-rectifying heterojunction also termed an <<ohmic contact>>.

According to one variant of implementation, the second junction layer is a region of the superficial thin layer, so-called contact region, having a second type of conductivity opposed to the first type of conductivity, the contact region being in contact with the intermediate region. The doping impurity concentration of the intermediate region is lower than that of the contact region.

In the detector embodiment having a junction of Schottky type, the superficial layer may comprise an unintentionally doped region in contact with the layer of first metal and a doped, so-called contact, region.

The, highly doped, contact region allows a conductor contact point to be formed on the unintentionally doped region. It subsequently has the same function as the layer of second metal.

Therefore, the detector may comprise a connection, accessible through one of the outer faces of the SOI structure for the contact point, this connection crossing the superficial thin layer or crossing the layer of silicon oxide and silicon substrate.

According to one particular embodiment of a detector of the invention, said portion of superficial thin layer, electrically insulated, may have at least two opposite sides, substantially parallel to one another, and substantially perpendicular to the layer of silicon oxide. The first and second layers of junction material are then respectively located on the opposite sides.

According to one advantageous aspect of the above-described embodiment, the detector may have at least one insulation groove crossing the superficial thin layer and surrounding the portion of superficial thin layer.

A further object of the invention is a process for manufacturing a detector such as described above. According to the first embodiment in which the diode has a junction of Schottky type, the process may comprise the following stages in which:

a layer of electric insulating material is formed on one free face of a superficial thin layer of silicon of silicon-on-insulator type (SOI), the structure comprising a stack made up of a silicon substrate, a layer of silicon oxide and the superficial thin layer.

in the layer of electric insulating material an opening is made forming the boundary of a detection zone, a layer of electric conductor material, in contact with said free surface of the superficial layer, is formed in the opening, which forms with the superficial layer a junction of Schottky type, the silicon substrate and the layer of silicon oxide are locally etched to form a rear access opening to the superficial layer, in the detection zone, a layer of electric conductor material is formed in contact with the superficial layer in said rear access opening, forming with the superficial layer an ohmic contact.

According to a further embodiment, in which the diode comprises a PN junction, the process may comprise the following stages:

a) forming a layer of insulating material on one free face of a superficial layer of a wafer having a structure of SOI type and comprising a stack made up of a silicon substrate, a layer of silicon oxide and the superficial thin layer of silicon, the superficial thin layer comprising a first doped region having a first type of conductivity and a first concentration of impurities, and a second doped region with the same type of conductivity and having a second concentration of impurities that is greater than the first concentration, the second region being in contact with the layer of silicon oxide and embedded in the first region.

b) making an opening in the layer of electric insulating material which forms the boundary of a detection zone, c) doping the superficial thin layer in the detection zone to form a third region with impurities of a second type of conductivity opposed to the first type of conductivity.

d) heat annealing the wafer e) the first, second and third doped regions respectively forming the intermediate region, the contact region and the detection region, the process also comprising the formation of electric contact points on the second and third doped regions.

According to one aspect of the invention, during the fabrication of the SOI structure, a superficial thin layer may be formed comprising two stacked sub-layers which respectively make up the first and second doped regions.

Other characteristics and advantages of the present invention will become apparent from the following description referring to the appended figures and drawings that are given solely for illustrative purposes and are not restrictive.

SHORT DESCRIPTION OF THE FIGURES

FIG. 1, already described, is a simplified diagram of a radiation detector explaining its operating principle, FIGS. 2A to 2F are sections, on a smaller scale, of structures for the fabrication of a radiation detector in accordance with the invention. They illustrate the stages of a first mode of manufacture of such detector.

Figure 4:
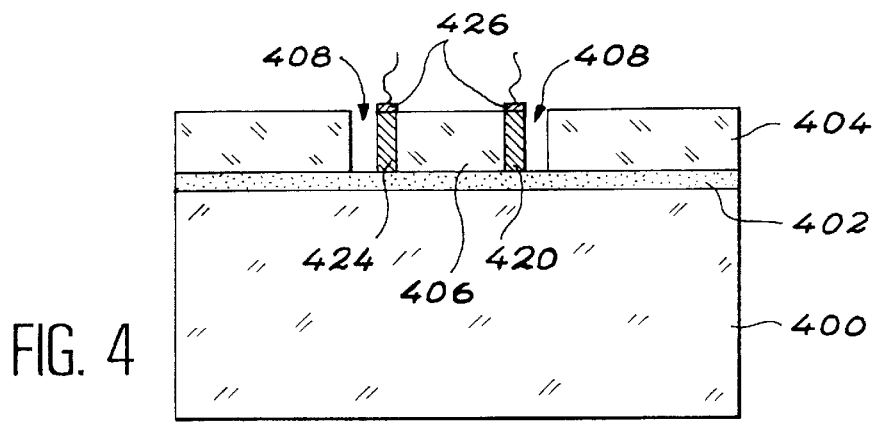
Figure 5:
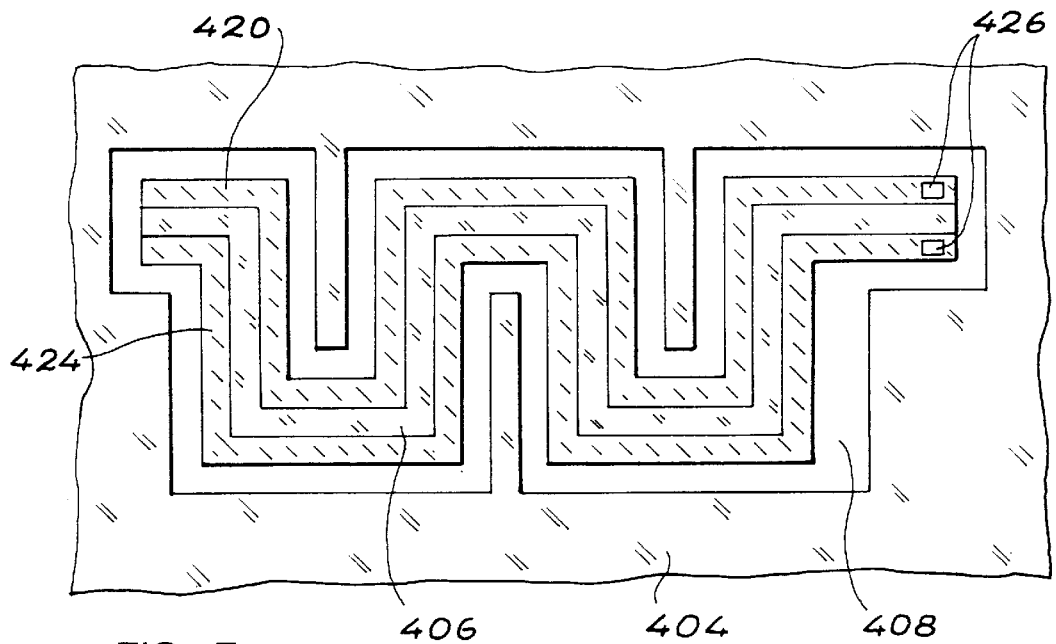

FIGS. 3A to 3F are sections of structures for the manufacture of a radiation detector in accordance with the invention. They illustrate the stages of a second mode of manufacture of such detector, FIG. 4 is a section view of a particular embodiment of a detector of the invention, FIG. 5 is a top view of the detection diode of the detector in FIG. 4, FIGS. 6A to 6E are diagram sections illustrating the successive stages of a third mode of manufacture of a detector in accordance with the invention.

DETAILED DESCRIPTION OF PARTICULAR MODES OF MANUFACTURE

One process for manufacturing a detector of the invention is illustrated in FIGS. 2A to 2F. It particularly concerns a detector in which the junction and contact layers are metal layers.

Figure 2A:
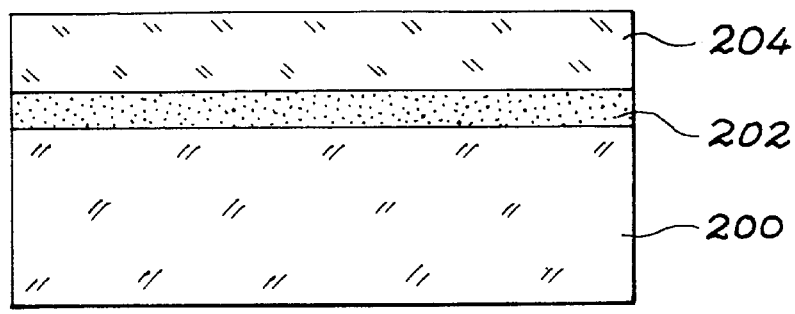

As is shown in FIG. 2A, the process starts with a substrate of silicon on insulator type (SOI) which comprises a stack made up of a silicon substrate 200, an insulating layer of silicon oxide 202 and a superficial thin layer 204. The thickness of these layers 200, 202, 204 is, in the described example, approximately 300 μm, 0.1 μm and 5 μm.

In general manner, the layer of silicon oxide 202 preferably has a thickness of between approximately 0.1 and 5 μm. The thin superficial layer 204, which is the active layer of the detector, is preferably between 0.1 μm and 100 μm thick.

The thickness of thin layer 204 is chosen in particular in relation to the type and energy of the radiation it is wished to detect.

Such SOI structures may be made using known techniques. They are for example made by implanting oxygen ions using the so-called SIMOX process (Separation by Implanted Oxygen), or by direct bonding using a so-called SDB process (Silicon Direct Bonding). Such structures are also commercially available in the form of wafers 6 inches in diameter.

In the case of the described example, superficial layer 204 is a silicon layer of N type having high resistivity. Its resistivity is in the region of 100 Ω.cm.

Figure 2B:
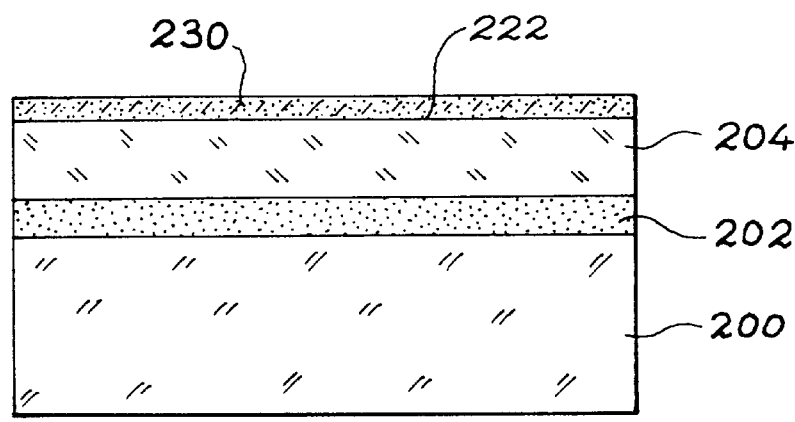

During a first stage, illustrated in FIG. 2B, a layer of silicon nitride 230 approximately 0.2 μm thick is placed on superficial layer 204. Layer 230 has an electric insulating function. It is placed on the free face 222 of layer 204. An opening 232 is then made in layer 230 to expose a portion of superficial thin layer. Opening 232 is obtained by using known lithography processes which essentially comprise depositing a layer of photosensitive resin, forming a mask in this resin, with a mask opening corresponding to the opening it is required to make in the layer of silicon nitride, etching the silicon nitride layer through the mask opening and removing the remaining resin.

Figure 2C:
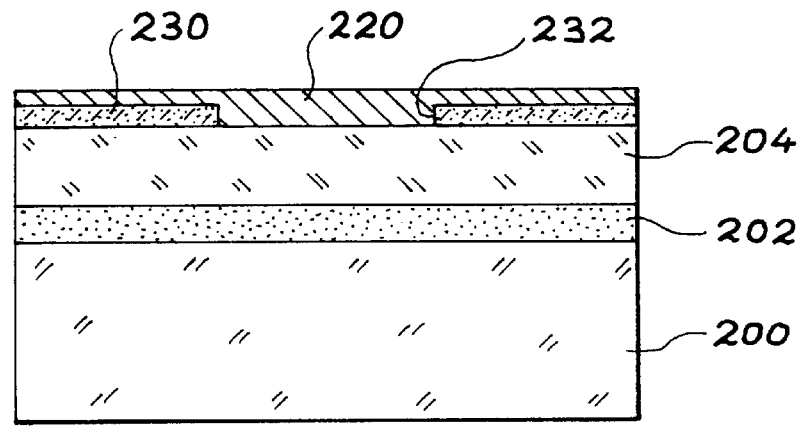

Opening 232, visible in FIG. 2C, borders a portion of superficial thin layer in which the detection diode is made and, consequently a detection zone of the detector.

During a following stage, a layer of gold 220 whose density is in the region of 40 μg/cm² is formed by evaporation on the surface of the silicon nitride layer 230 and in opening 232. Gold layer 220 is in contact with the portion of the superficial thin layer 204 in opening 232. With the portion of superficial thin layer it forms a junction of Schottky type. Gold layer 220 also forms a first polarization terminal of the detection diode of the detector.

Figure 2D:
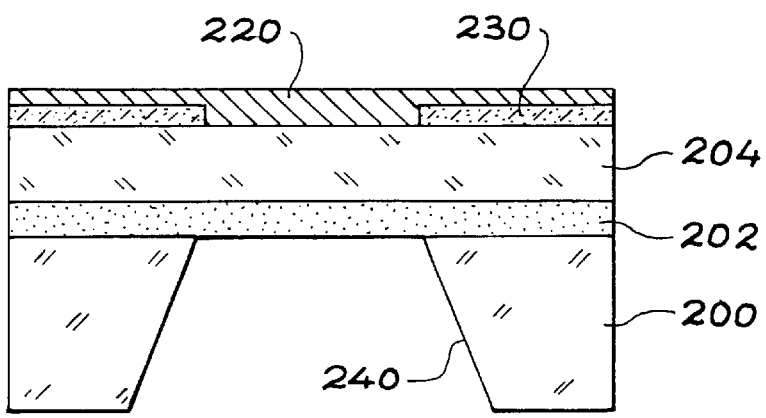
Figure 2E:
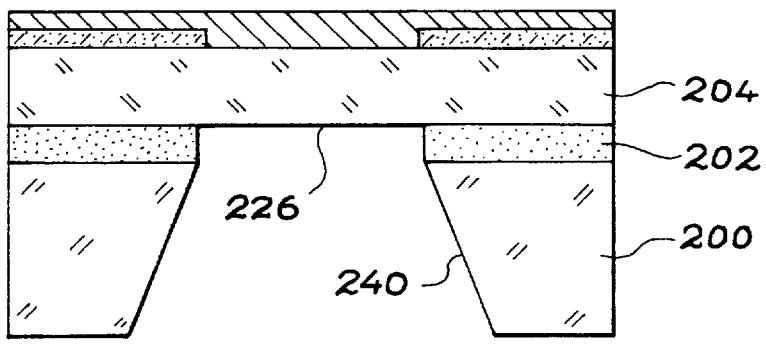

As is shown in FIGS. 2D and 2E, substrate 200 and insulating layer 202 are subsequently etched locally in order to from therein an access opening 240 to face 226 of the superficial thin layer opposite the free face. Opening 240 is etched in the detection zone in order to reach the portion of superficial thin layer whose free face is in contact with gold layer 220.

As an indication, the silicon of substrate 200 is etched at 85° C. in a potash solution (KOH) comprising 130 g KOH and 300 ml water. The silicon nitride of layer 202 is etched at 20° C. with a hydrofluoric acid solution (HF) comprising 10% HF and 90% water.

During etching, the portions of substrate and insulating layer surrounding the detection zone are protected by a mask that is not shown.

Figure 2F:
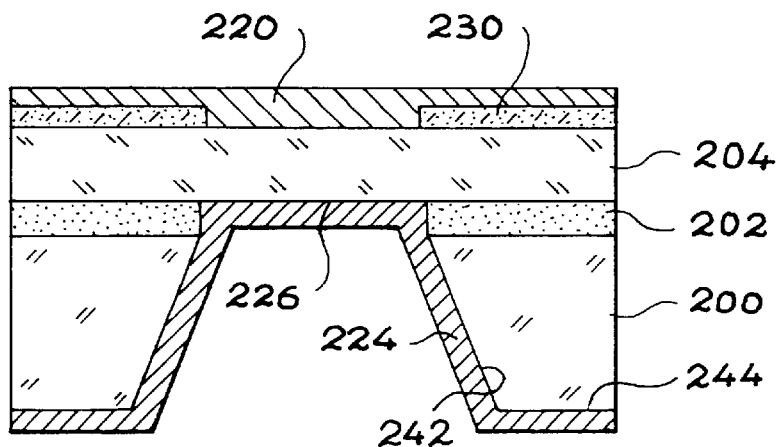

A final stage, corresponding to FIG. 2F, comprises the formation of an aluminium layer 224. This layer covers sides 242 of opening 240, the free face 244 of substrate 200 and, in particular, face 226 of the portion of thin layer 204 which corresponds to the detection zone. The aluminium layer 224 also has a density in the region of 40 μg/cm² and is deposited by evaporation.

Layer 224 forms with layer 204 an ohmic contact and constitutes a second terminal of the detection diode. When the detector is in operation, a suitable polarizing voltage is therefore applied between layers 220 and 224. The voltage applied to aluminium layer 224 is positive in relation to the voltage applied to gold layer 220 in such manner as to <<reverse>> polarize the junction, that is to say according to a rectifying assembly. It is also on these layers 220 and 224 that the charges are collected for the formation of a detection signal.

The detectors obtained with this process may have a superficial layer that is sufficiently thin so that it does not weaken in significant manner the flow to energy of the radiation's to be detected. They may for example be applied to on-line flow control. The detectors may also be used to measure flight time. For example, to measure the flight time of alpha particles of 5.5 MeV, the thickness of the superficial thin layer is chosen to be 0.5 μm, which corresponds to an energy loss of 100 keV in each detector of a pair of detectors. Finally, the detectors may be segmented into a multiplicity of detection pixels, to determine the direction of detected particles.

FIG. 3A to 3F illustrate another process for manufacturing a detector of the invention. This process relates more particularly to the manufacture of a detector in which the <<junction>> and <<contact>> layers are in doped silicon. Identical references, to which 100 is added, are given to the parts in FIGS. 3A to 3F which correspond to identical or similar parts in FIGS. 2A to 2F.

Figure 3A:
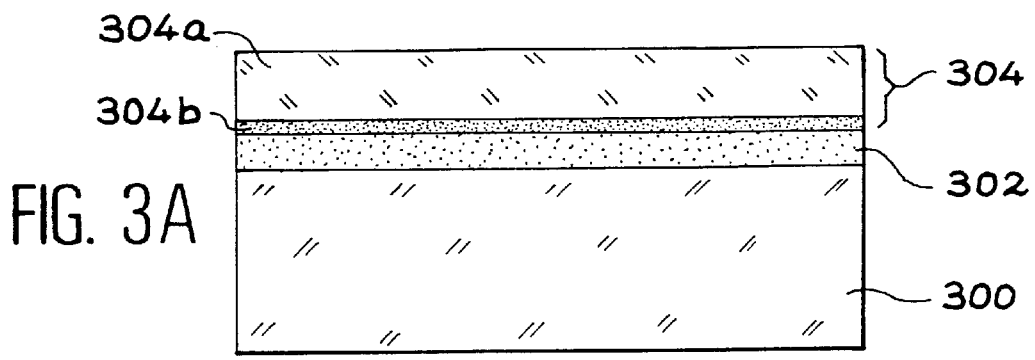

As is shown in FIG. 3A, the process starts with a wafer having a structure of SOI type which comprises a silicon substrate 300, an insulating layer of silicon oxide 302 and a superficial thin layer 304 in silicon of P type. Layer 304 comprises a first sub-layer 304a which forms a first doped region (P type) having high resistivity, and a second sub-layer 304b which connects first sub-layer 304a to the oxide layer 302.

Second sub-layer 304b, embedded under sub-layer 304a, forms a second doped region, also of P type, but with a higher concentration of impurities. It has lower resistivity. Sub-layers 304a and 304b respectively correspond to a so-called intermediate region and a so-called contact region of the detector.

By way of indication, sub-layers 304a and 304b have a resistivity of more than 100 Ω.cm and a resistivity of less than 0.1 Ω.cm respectively.

Sub-layers 304a and 304b may, for example, be formed by implanting boron impurities in a SOI substrate during the stages of manufacture of the substrate using the SDB technique (Silicon Direct Bonding). Wafers of SOI structure equipped with sub-layers 304a and 304b are commercially available.

Figure 3B:
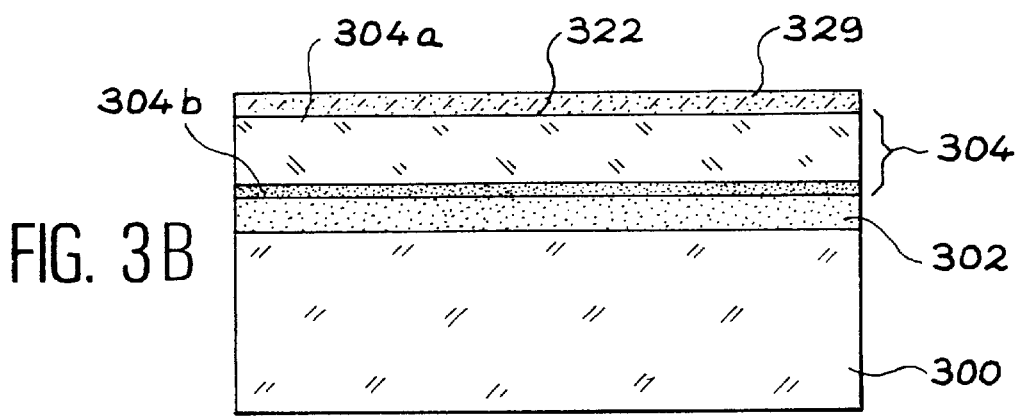

A second stage, as is shown in FIG. 3B, consists of forming an insulating layer 329 of silicon nitride on the free face 322 of the superficial thin layer, in contact with sub-layer 304a.

Figure 3C:
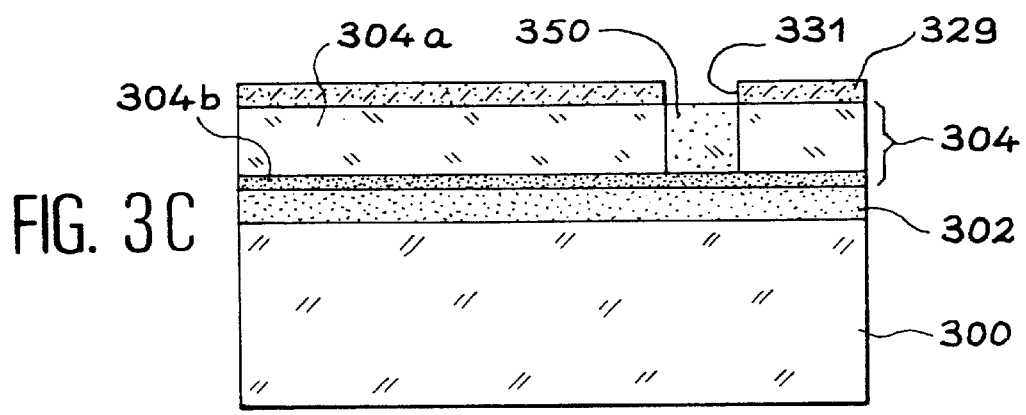

FIG. 3C shows the fabrication of contact point on sub-layer 304b which, in this example, forms the contact region such as previously described. An opening 331 is made in insulating layer 329 to expose a region of the superficial thin layer 304. The opening is made using the above-mentioned lithography processes which are known. It has a surface area of, for example, 500 μm×500 μm. The implantation of boron ions with an increasing energy of 0 to 2 MeV at a dose of $1.10^{16}$ ions/cm$^3$ allows a channel 350 to be formed of type P+ that is approximately 5 μm long and crosses sub-layer 304a. Channel 350, visible in FIG. 3C, forms a contact point on sub-layer 304b which corresponds to the contact zone. The concentration of impurities in the channel is finally in the region of $10^{19}$ ions/cm$^3$. The layer of silicon nitride 329 is then removed by chemical etching with a hydrofluoric acid solution.

Figure 3D:
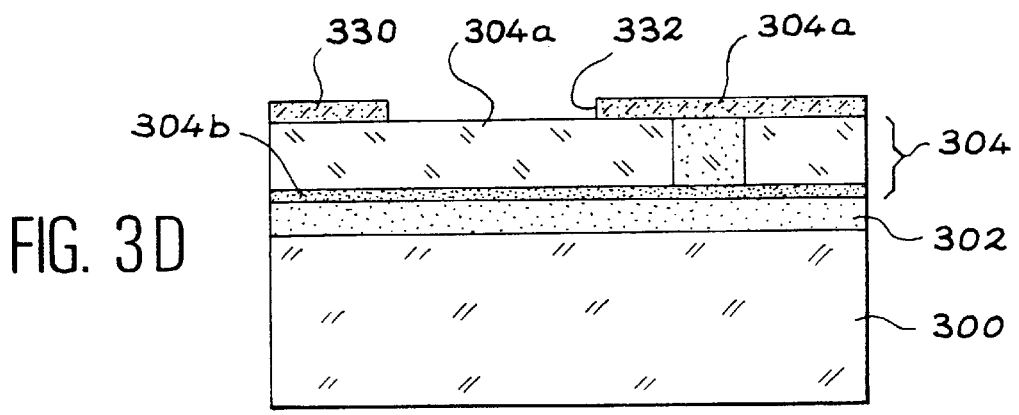

As is shown in FIG. 3D, a following stage consists of forming on the free face of layer 304 a further insulating layer of silicon nitride 330 approximately 1 μm thick. In this layer an opening 332 is made to expose a portion of the free surface of superficial layer 304, which corresponds to the detection region. Opening 332 is made using known lithography processes.

Figure 3E:
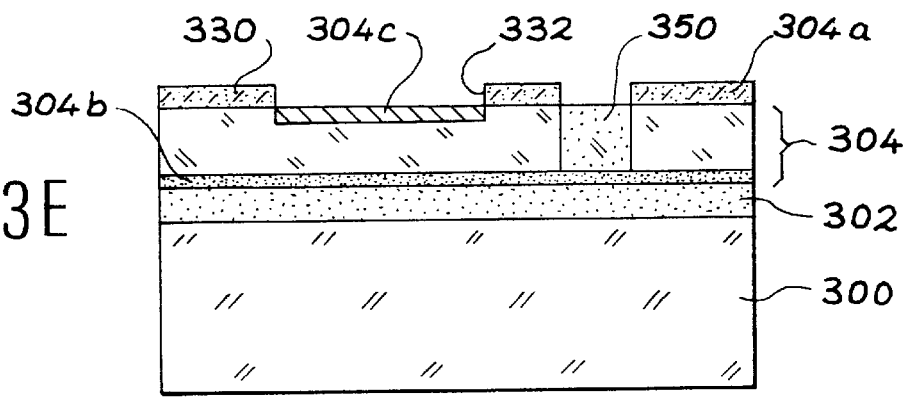

Ionic implantation of phosphorus in opening 332, with an energy of 150 jeV at a dose of $1.10^{15}$ ions/cm$^3$, will form, as is shown in FIG. 3E, a region 304c of N+ type whose thickness is in the region of 0.2 μm. This region constitutes the detection region in the meaning of the present invention. With the superficial thin layer it forms a rectifying junction.

Annealing of the structure at 1100° C. for 20 seconds is conducted to activate the doping impurities and remedy implantation defects.

Figure 3F:
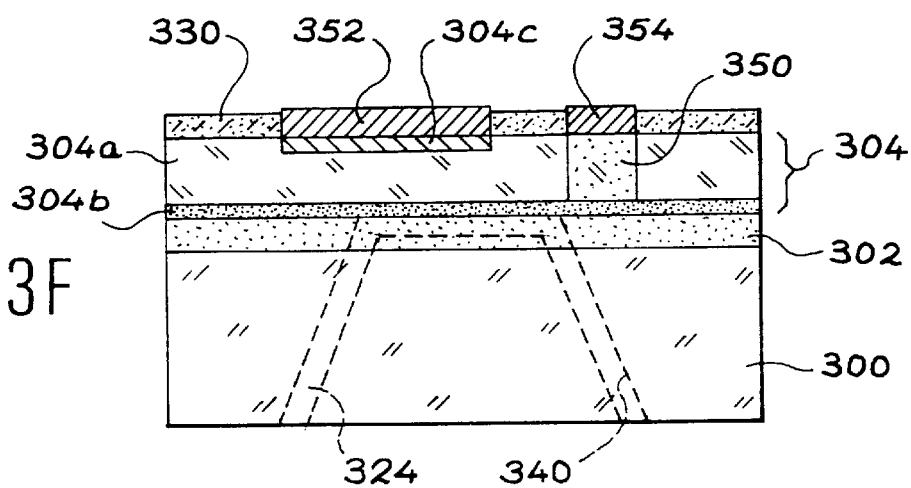

FIG. 3E, finally shows the opening of a window in layer 330 above channel 350, and FIG. 3F shows the fabrication of contact pads 352, 354 on region 304c and channel 350 respectively. The contact pads are made by evaporation of aluminium. Their density is in the region of 100 μg/cm3. Contact pad 352, and pad 354 associated with the previously described conductor channel 350, form contact points on the terminals of the diode.

In this embodiment, region 304c and sub-layer 304b respectively correspond to junction and contact layers; the former forms with sub-layer 304a the detection diode. They are polarized via contact points 352, 354, 350 to which a suitable voltage is applied to reverse polarize junction NP. A negative voltage is applied to sub-layer 322 via channel 350.

As shown by the chain-dotted line in FIG. 3F, the contact point on sub-layer 304b may also be made through the rear face using a process similar to that already described to make an ohmic contact for the device in FIG. 2F. In this case, the silicon substrate 300 and layer of silicon oxide 302 are etched locally to form a rear access opening 340 to the contact region, that is to say sub-layer 304b.

A layer of electric conductor material 324 is then formed, for example in aluminium, in the rear opening, in contact with sub-layer 304b. This layer of conductor material therefore also forms a contact point on the contact region of the diode.

The detector obtained with this second process has good mechanical resistance, in particular in its version with contact points per doped regions. It may, for example, be associated with a boron isotope film 10, formed on the surface of the stack, to constitute a neutron detector. The boron isotope film 10 consequently assures the conversion of the neutrons into alpha particles. In this way a neutron detector is obtained that is little sensitive to gamma radiation noise. By juxtaposing a multiplicity of such detectors equipped with a superficial film of boron, neutron selective dosimeters can be obtained vis-à-vis gamma particles.

FIG. 4 shows a variant of the embodiment of a detector in accordance with the invention.

The detector is made from a SOI structure comprising a substrate 400 in doped silicon having N⁻ type conductivity, a thin layer of silicon oxide 402 and a superficial thin layer 404 also in N⁻ doped silicon.

The present description explicitly refers to a transistor made from a SOI substrate whose silicon is of N type conductivity. An equivalent detector may be obtained by replacing, mutatis mutandis, the N doped parts by P doped parts.

One portion 406 of the superficial thin layer is electrically insulated by silicon oxide layer 402 and by a groove 408 crossing though the superficial thin layer perpendicular to its free surface, and extending as far as the oxide layer 402.

Highly doped regions 420, 424, of P⁺ and N⁻ type respectively, are formed on the sides opposite to layer portion 406. These sides are substantially perpendicular to the silicon oxide layer and parallel to one another.

P⁺ and N⁺ doped regions 420, 424 located on said opposite sides respectively form the first and second junction layers as construed by this invention. N⁺ region 424 forms with N type portion 406 of thin layer a so-called <<ohmic junction>>, and P⁺ region 420 forms with portion 406 of thin layer a so-called <<rectifying>> junction.

Contact points 426 on regions 420 and 424, shown in a very simple diagram, form reading electrodes for the detector. They may be connected to counter means and/or appropriate spectroscopy means not shown.

FIG. 5 is a partial top view of FIG. 4. It will be noted, however, that FIGS. 4 and 5 are not on the same scale and that, for reasons of clarity, the proportions of the different parts are not necessarily observed. In this figure are shown portion 406 of the superficial thin layer forming part of the detection diode, regions 420, 424 forming the first and second junction layers on the sides of portion 406 of the thin layer, groove 408 and part of the remaining superficial thin layer 404.

In this figure, it is observed that the portion of thin layer has a notched shape.

In this embodiment, the superficial thin layer comprises a multiplicity of sections with opposite sides parallel to one another. It will be seen that regions 420 and 424 forming the first and second junction layers extend over the opposite sides of these sections. The contact points on regions 420 and 424 are represented by the reference 426.

Figure 6A:
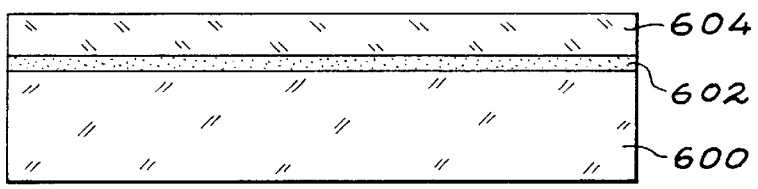

The description will now be given of third mode of fabrication of a detector in accordance with the invention, with reference to FIGS. 6A to 6E As is shown in FIG. 6A, the processes uses a SOI structure comprising a silicon substrate 600, a thin layer of silicon oxide 602 and a superficial thin layer 604 in silicon.

In the example described, the superficial thin layer is of N conductivity type. However, a similar detector may be obtained with a P type layer. The structure in FIG. 6A is comparable with that in FIG. 2A, and in this respect reference may be made to the previous description.

Figure 6B:
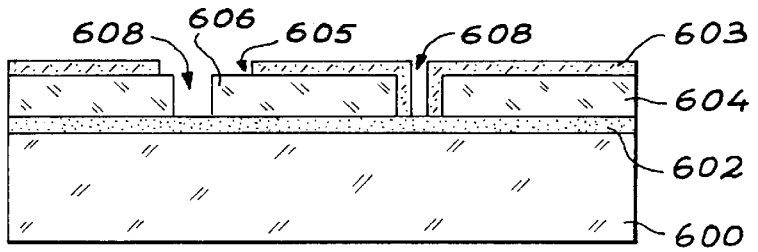

A first stage, illustrated in FIG. 6B, consists of etching in the superficial thin layer one (or more) groove(s) 608, substantially perpendicular to the free surface of the superficial thin layer and substantially perpendicular to silicon oxide layer 602. Groove 608 borders and laterally insulates a portion 606 of superficial thin layer forming part of the detection diode.

Portion 606 of superficial thin layer is also electrically insulated from substrate 600 by oxide layer 602.

A following stage consists of heat oxidation of the superficial thin layer, including in the grooves. An oxide layer 603 therefore covers the entire superficial thin layer in particular portion 606 of this layer.

A first opening 605 made in the thermal oxide layer 603 exposes a first side of portion 606 of the superficial thin layer. Opening 605 is made using usual engraving techniques such as photoengraving.

Figure 6C:
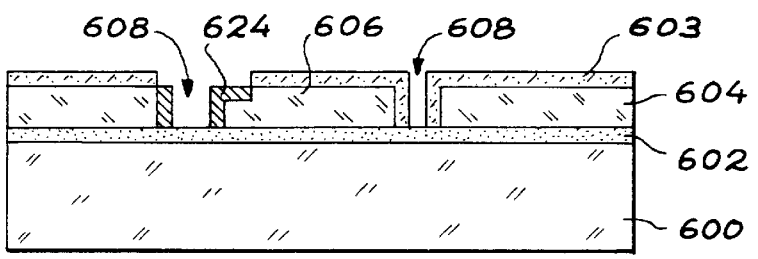

As is shown in FIG. 6C, doping is conducted in opening 605 to form a region 624 of $N^+$ type forming a junction layer on this exposed side. This junction layer is the <<second>> junction layer in the meaning of the present invention and forms with portion 606 a so-called <<ohmic>> junction.

A following stage comprises oxidizing annealing in particular to close opening 605 and protect region 624.

A second opening 607 is made in the thermal oxide layer to expose a second opposite side of portion 606 of the superficial thin layer.

Figure 6D:
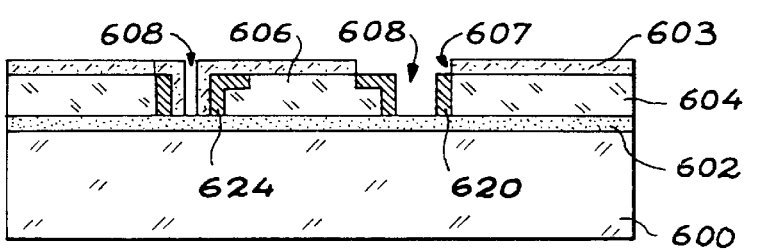
Figure 6E:
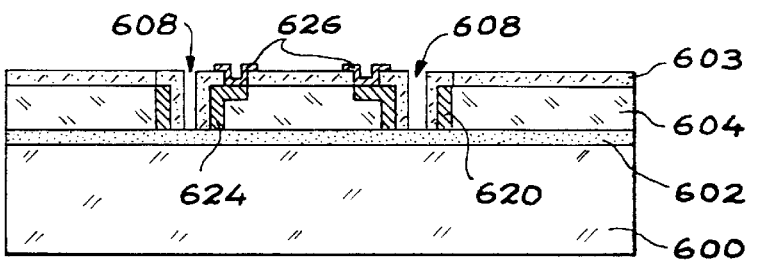

Further doping, made in opening 607, forms, as is shown in FIG. 6D, a region 620 of $P^+$ type also forming a junction layer. It is the <<first>> so-called <<rectifying>> layer in the meaning of the present invention.

A last stage consists of a second oxidizing annealing operation to protect region 620 and comprises the formation of contact points 626 on doped regions 620 and 624 of portion 606 of the superficial thin layer. These contact points form polarizing and reading electrodes of the diode.

At the end of this process a detector is obtained that is similar to that already described in FIG. 4.

Documents Cited in the Disclosure (1)
<<Integration of CMOS electronics and particle detector diodes in high-resistivity silicon-on-insulator wafers>> by B. Dierickx et al., IEEE Transaction On Nuclear Science, vol.40, n°4, August 1993, pages 753–758

(2)
DE-A-3 333 410 (abstract)

(3)
JP-A-63 055 980

What is claimed is:

1. Ionizing radiation detector with a detection diode formed in a superficial thin layer of SOI structure comprising a stack made up of a silicon substrate, an insulating layer of silicon oxide and superficial thin layer of silicon, the diode comprising a first junction layer and a second junction layer in contact with at least one portion of the superficial thin layer, respectively forming with said portion of superficial thin layer a rectifying junction and an ohmic junction capable of establishing, by application of a voltage, an electric detection field in said portion of thin layer, characterized in that the first and second junction layers have main faces facing one another that are substantially parallel to establish a substantially constant electric field between them.

2. Detector in accordance with claim 1, wherein said first junction layer is a layer of a first metal placed in contact with a first face of the portion of superficial thin layer to thereby form a Schottky type junction.

3. Detector in accordance with claim 1, wherein said first junction layer is a first region of said superficial thin layer and has a first type of conductivity, said first region being in contact with an intermediate region of said superficial thin layer, the intermediate region having a second type of conductivity opposed to the first type of conductivity, the first region and the intermediate region thereby forming a PN type junction.

4. Detector in accordance with claim 2, wherein said second junction layer is a layer of a second metal placed in contact with a second face of the superficial thin layer, and forming an ohmic contact with the superficial thin layer.

5. Detector in accordance with claim 1, wherein the is first junction layer is a first region of said superficial thin layer and has a first type of conductivity, and wherein the second junction layer defines a contact region of the superficial thin layer, the contact region, having a second type of conductivity opposed to the first type of conductivity, the contact region being in contact with an intermediate region of the superficial thin layer, the superficial thin layer having a doping impurity concentration lower than that of the contact region.

6. Detector in accordance with claim 2, wherein the portion of superficial layer comprises an intrinsically doped region in contact with the layer of first metal and a doped contact region.

7. Detector in accordance with claim 1, in which the superficial layer has a resistivity of more than 100 Ω.cm.

8. Detector in accordance with claim 2, the first metal is gold.

9. Detector in accordance with claim 4, wherein the second metal is aluminium.

10. Detector in accordance with claim 4, wherein the layers of first and second metal have a surface density in the region of 40 $\mu g/cm^2$.

11. Detector in accordance with claim 3, wherein the first type of conductivity is N-type conductivity, and the second type of conductivity is P-type conductivity.

12. Detector in accordance with claim 3, further comprising a contact point electrically connected to said second junction layer, crossing the intermediate region.

13. Detector in accordance with claim 1, wherein the superficial thin layer is between 0.1 and 100 $\mu m$ thick.

14. Detector in accordance with claim 1, wherein the layer of silicon oxide is between 0.1 and 5 $\mu m$ thick.

15. Detector in accordance with claim 1, wherein said portion of superficial thin layer is electrically insulated and has at least two opposite sides, substantially parallel to one another, and substantially perpendicular to the layer of silicon oxide, and in that the first and second junction layers are respectively located on the opposite sides.

16. Detector in accordance with claim 15, further comprising at least one insulating groove surrounding the portion of superficial thin layer.

17. Detector in accordance with claim 16, wherein the portion of superficial thin layer has, along a plane parallel to the layer of silicon oxide, a notched pattern.

18. Detector in accordance with claim 4, in which the layers of first and second metal have a surface density in the region of 40 $\mu/cm^2$.

19. Process of manufacturing an ionizing radiation detector using a structure of silicon-on-insulator type SOI, the structure having a stack made up of a silicon substrate, a layer of silicon oxide and superficial thin layer, said process comprising:

forming a layer of electric insulating material on a free face of the superficial thin layer of silicon; forming an opening in the electric insulating material to thereby provide a boundary of a detection zone;

forming a first junction layer using a first electric conductor material in contact with said free face of the superficial layer in opening, the first junction layer being of Schottky type;

locally etching the silicon substrate and the layer of silicon oxide to form a rear access opening to the superficial layer, in the detection zone; and forming a second junction layer using a second electric conductor material, in contact with the superficial layer in said rear access opening, the second junction layer forming an ohmic contact with the superficial layer.

20. Process in accordance with claim 19, wherein the first and second electric conductor materials are gold and aluminium, respectively.

21. Process in accordance with claim 19, wherein the electric insulating material is silicon nitride.

22. Process in accordance with claim 19, wherein the resistivity of the superficial thin layer of silicon is more than 100 Ω.cm.

23. Process of manufacturing an ionizing radiation detector using a structure of SOI type having a stack made up of a silicon substrate, a layer of silicon oxide and superficial thin layer of silicon, the superficial thin layer comprising a first doped region, forming a first junction layer, and having a first type of conductivity and a first impurity concentration, and a second doped region forming a second junction layer, with the same type of conductivity and having a second concentration of impurities higher than the first concentration, the second region being in contact with the layer of silicon oxide and being embedded in the first region, the process comprising the stages of:

a) forming a layer of insulating material on one free face of the superficial layer;

b) forming in the layer of electric insulating material, an opening which defines a detection zone;

c) doping the superficial thin layer in the detection zone to form a third region with impurities having a second type of conductivity opposed to the first type of conductivity;

d) heat annealing the wafer; and e) forming on the second and third doped regions.

24. Process in accordance with claim 23, in which the formation of an electric contact point on the second region comprises the fabrication of an electric conductor channel crossing the first doped region of the superficial thin layer, the conductor channel being made between stages a) and b) of the process.

25. Process in accordance with claim 24, wherein fabricated of the conductor channel comprises:

forming an opening in the layer of electric insulating material, the opening corresponding to a rear control zone of the superficial thin layer; and doping superficial thin layer.

26. Process in accordance with claim 23, in which the formation of an electric contact point on the second region comprises:

locally etching the silicon substrate and the layer of silicon oxide to form a rear access opening to superficial thin layer in the second doped region; and forming a layer of electrical conductor material in contact with the second doped region in said rear access opening.

27. Process in accordance with claim 23, in which the first and second doped regions are made with P-type conductivity, and the third region with N-type conductivity.

28. Process in accordance with claim 23, further comprising:

cutting groove in the superficial thin layer to border the portion of superficial thin layer;

heat oxidizing the superficial thin layer, including in the groove;

exposing a first side of the portion of superficial thin layer;

N+ doping the first exposed side;

performing initial oxidizing annealing on the first exposed side;

exposing a second side of the portion of superficial thin layer, opposite the first side;

P+ doping the second exposed side;

performing a second oxidizing annealing on the second exposed side; and forming electric contact points on the doped sides.

\* \* \* \* \*